United States Patent [19]

Fulkerson et al.

[11] Patent Number: 4,687,994
[45] Date of Patent: Aug. 18, 1987

[54] POSITION SENSOR FOR A FUEL INJECTION ELEMENT IN AN INTERNAL COMBUSTION ENGINE

[75] Inventors: David E. Fulkerson, Minnetoaka; Marvin L. Geske, Plymouth, both of Minn.

[73] Assignee: George D. Wolff, Winter Haven, Fla.

[21] Appl. No.: 633,235

[22] Filed: Jul. 23, 1984

[51] Int. Cl.4 ............................................ G01R 33/06
[52] U.S. Cl. .................................... 324/251; 324/208; 73/119 A; 307/309
[58] Field of Search ............... 324/251, 207, 208, 225, 324/235, 244, 260; 73/119 A; 338/32 H; 307/309, 310, 491, 494, 542; 328/162, 165

[56] References Cited

U.S. PATENT DOCUMENTS

| | | | |
|---|---|---|---|
| 3,219,909 | 11/1965 | Foster | 324/251 X |
| 3,697,870 | 10/1972 | Brenner | 324/244 |
| 3,991,361 | 11/1976 | Mattern et al. | 324/244 |
| 4,163,160 | 7/1979 | Frazee | 307/309 X |
| 4,163,947 | 8/1979 | Weedon | 328/162 X |
| 4,371,837 | 2/1983 | Sieverin | 324/251 X |
| 4,531,491 | 7/1985 | Iiyama et al. | 73/119 A X |
| 4,541,271 | 9/1985 | Flaig et al. | 73/119 A X |

OTHER PUBLICATIONS

IBM Technical Disclosure Bulletin, vol. 21, No. 7, 12-78, Bolash et al, pp. 2717-2718.

Primary Examiner—Reinhard J. Eisenzopf
Assistant Examiner—Robert W. Mueller
Attorney, Agent, or Firm—Duckworth, Allen, Dyer & Pettis

[57] ABSTRACT

A system is provided for dynamically detecting and providing an electronic output representative of changes in the position of a fuel injection element in an internal combustion engine. The system includes an electronic circuit having a sensor for sensing a change in a magnetic field external to the circuit, and providing an output representative of the change. Circuit elements are electronically coupled with the output of the sensor for providing an output indicating the presence of the magnetic field change. A nulling circuit is provided for nulling the electronic circuit responsive to the sensor output, to thereby compensate for ambient magnetic fields, temperature and process variations. Exceptionally low current circuit characteristics are achieved in an integrated circuit configuration and geometry having very low junction leakage characteristics.

10 Claims, 6 Drawing Figures

POSITION SENSOR FOR A FUEL INJECTION ELEMENT IN AN INTERNAL COMBUSTION ENGINE

BACRGROUND OF THE INVENTION

1. Field of the Invention

The present invention relates generally to internal combustion engines, and more particularly relates to techniques for sensing the position of a fuel injection element, such as a needle injector, poppet valve or the like, in an internal combustion engine in order to provide a dynamic electronic signal for increasing engine operating efficiency.

2. Description of the Prior Art

Diesel engines typically employ needle or poppet valves which are opened and closed at timed intervals to inject desired amounts of fuel into the cylinder for combustion. In order to maximize fuel efficiency and minimize undesirable exhaust emissions, it is necessary to detect the operation of the fuel injection element in relation to engine crankshaft position. The opening of the fuel injection element (i.e. needle valve, poppet valve, etc.) can then be set or controlled in timed relationship to the engine crankshaft position. In this regard, it is known that the initial displacement between the fuel injection element and its corresponding seat determines the beginning of injection. It is therefore necessary to time or control the initial displacement of the needle from the seat relative to the rotational position of the engine crankshaft, in order to maximize fuel efficiency and reduce undesirable emissions.

In U.S. Pat. Nos. 4,359,895; 4,386,522; and 4,397,180, Wolff and Ziemacki disclose various valve position sensors for needle and poppet valves employing a Hall-Effect sensor for detecting the movement of a magnet located with the needle or poppet valve.

Other prior art of interest includes the following U.S. Pat. Nos.: 3,913,537 to Ziesche, et al.; 3,605,703 to Moulds; 2,605,141 to Pyke, et al.; 4,046,112 to Deckard; 4,161,161 to Bastenhof; 4,036,192 to Nakayama; 4,069,800 to Kanda, et al.; 3,952,711 to Kimberley, et al.; 3,921,604 to Links; 4,050,431 to Jackson; 3,796,206 to Links; 3,344,663 to Dreisin, et al.; 4,096,841 to Kindermann, et al.; 3,416,506 to Steiger. Additionally, the following foreign patents are also of interest: Germany Auslegeshrift No. 1,049,635; British Patent Specifications Nos. 841,202 and 443,124; and French Pat. No. 2,444,812.

The above-referenced Wolff and Ziemacki patents disclose numerous packaging configurations for electronic circuits employing a Hall-Effect sensor for measuring dynamic changes in a magnetic field for a magnet moving with a needle or poppet valve. Other prior art of interest with respect to integrated circuits in such an environment includes the following: "Impact of Silicon Substrates on Leakage Currents," Slotboom, et al., *IEEE Electron Device Letters*, Vol. EDL-4 No. 11, November, 1983; "Low Voltage Bipolar Circuits," by Derek Bray, Monochip Application Note APN-25, a publication of Interdesign, Inc.; and with respect to Hall Effect sensors, see *The Hall-Effect and its Applications*, C. L. Chein, et al., Plenum Press, New York, (1980), and particularly "The Hall-Effect in Silicon Circuits," an article therein by J. T. Maupin, et al.

SUMMARY OF THE INVENTION

The present invention relates to a system for dynamically detecting and providing an electronic output representative of changes in the position of a fuel injection element in an internal combustion engine. More particularly, the present invention contemplates an electronic circuit including means, such as a Hall Effect sensor, for sensing a change in a magnetic field external to the circuit and providing an output representative of the change. Circuit means are electronically coupled with the output of the sensing means for providing an output indicating the presence of the magnetic field change. A low current circuit is coupled with the output of the sensing means and across the indicating circuit means for nulling the electronic circuit responsive to the sensing means output, to thereby compensate for ambient magnetic field, temperature variations, processing defects and the like.

In accordance with the specific embodiment of the present invention, the nulling circuit operates at a very low current range, on the order of 2 to 3 nanoamperes, in conjunction with a capacitor coupled to the output of the low current nulling circuit, and with means for charging and discharging the capacitor responsive to any imbalance of the input to the indicating circuit means.

Further, in accordance with the preferred embodiment of the present invention, the electronic circuit is designed to perform the function of sensing a magnetic pulse while ignoring any background field, and operating without external components in a two terminal configuration over a wide temperature range. In connection with this function, the circuit is integrated into a monolithic semiconductor body utilizing a geometry with very low leakage transistors, in order to obtain very low current characteristics. In accordance with the specific embodiment of this invention, both the indicating circuit and the low current nulling circuit comprise comparators formed by planar transistors in a single monolithic semiconductor body, and in which low junction leakage characteristics are obtained with a specific semiconductor region configuration and the utilization of a highly doped base region extending outwardly and overlapping the base-collector junction in at least a portion of the base region. This feature is employed together with a highly doped substrate to achieve the low junction leakage characteristics.

The magnetic sensing means comprises a Hall Effect sensor integrated with the electronic circuit in the monolithic semiconductor body, and with the output thereof coupled with an amplifier which in turn provides outputs responsive to changes in the magnetic field as detected by the sensor, and which outputs are in turn provided to the indicating circuit and nulling circuit functions.

DETAILED DESCRIPTION OF THE PREFERRED EMBODIMENT

The aforementioned U.S. Pat. Nos. 4,359,895; 4,366,706; 4,386,522; and 4,397,180 to Wolff or to Wolff and Ziemacki teach a variety of header, lead and package configurations for valve position sensors for fuel injection elements in internal combustion engines, which header, lead and packaging configurations may be employed in connection with the electronic system of the present invention. The teachings of those four patents are therefore incorporated into this disclosure by reference.

Figure 1:
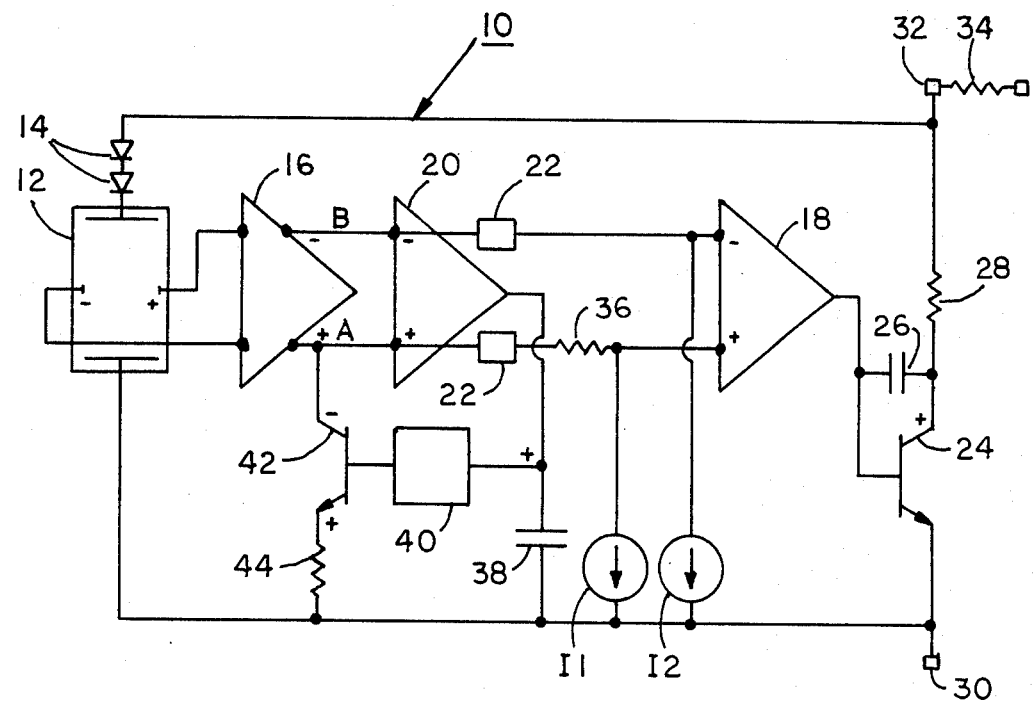
FIG. 1 is a block diagram circuit schematic illustrating an electronic sensing circuit in accordance with the present invention.

Referring now to FIG. 1, there is shown an electronic circuit for dynamically sensing and processing signals representative of changes in a magnetic field. While the circuit 10 of FIG. 1 may take the form of discrete circuit components, it is preferred that the entire circuit be integrated in a single monolithic semiconductor body, except for certain external components, as described in greater detail below.

The circuit 10 in accordance with the present invention includes a Hall-Effect sensor 12 having a function similar to the Hall-Effect sensor 44 disclosed in the aforementioned U.S. Pat. No. 4,359,895 to Wolff and Ziemacki (note FIGS. 2 and 3 of that patent). Temperature compensating diodes 14 are connected in series with the Hall sensor 12.

An amplifier 16 is coupled across the two terminal output of the Hall-Effect sensor 12, and in turn has a positive and negative output, A and B, respectively. Outputs A and B from amplifier 16 form an input to comparator circuits 18 and 20, which are coupled in parallel to the respective outputs in the manner shown in FIG. 1. An impedance matching circuit 22 is coupled to each input to comparator 18 in order to prevent impedance loading of comparator 20 and amplifier 16 by comparator 18. As will be described in greater detail below, comparator 20 relies on very low current characteristics in order to function as a nulling circuit for the entire electronic system 10.

The output of comparator 18 is coupled to the base of an output transistor 24, which is shunted by a high frequency roll-over limiting capacitor 26. A load impedance 28 is coupled in series with transistor 24 between output terminals 32 and 30. As is described in greater detail below, terminals 32 and 30 (supply and ground respectively) form the only input and output terminal connections to the circuit 10, which greatly simplifies its operation. An external current sensing resistor 34 is also provided in connection with the operation of the circuit 10.

Referring again to the input A to comparator 18, there is shown an offset impedance 36 between the impedance matching circuit 22 and the input to comparator 18. This offset resistance 36 determines the threshold for changes in the magnetic field, which typically would be adjusted in order to permit the sensing of changes in the magnetic field on the order of 30 to 200 Gauss. Current sources I1 and I2 are shunted across respective outputs A and B of the amplifier at the input side of comparator 18. The function and makeup of these current sources I1 and I2 will be more fully described below with reference to FIGS. 2 and 3; however, for purposes of this discussion, it should be noted that current sources I1 and I2 require a negative temperature coefficient.

Figure 4:
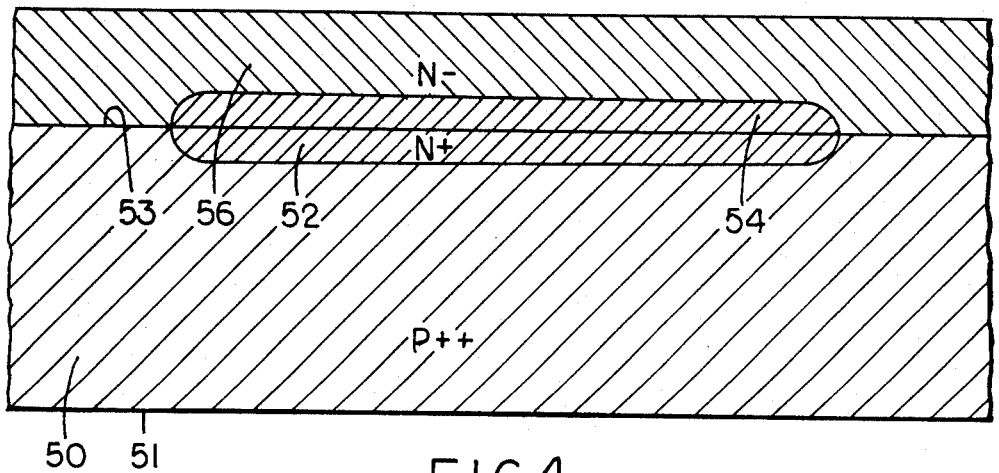
FIGS. 4, 5 and 6 illustrate sequential steps in the processing of a portion of an electronic integrated circuit component in accordance with the present invention.
Figure 5:
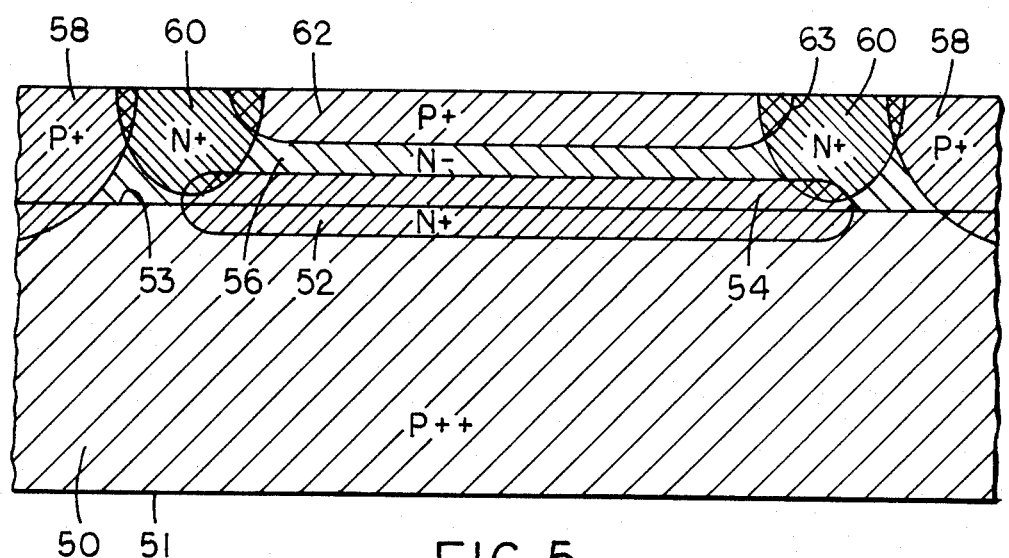
Figure 6:
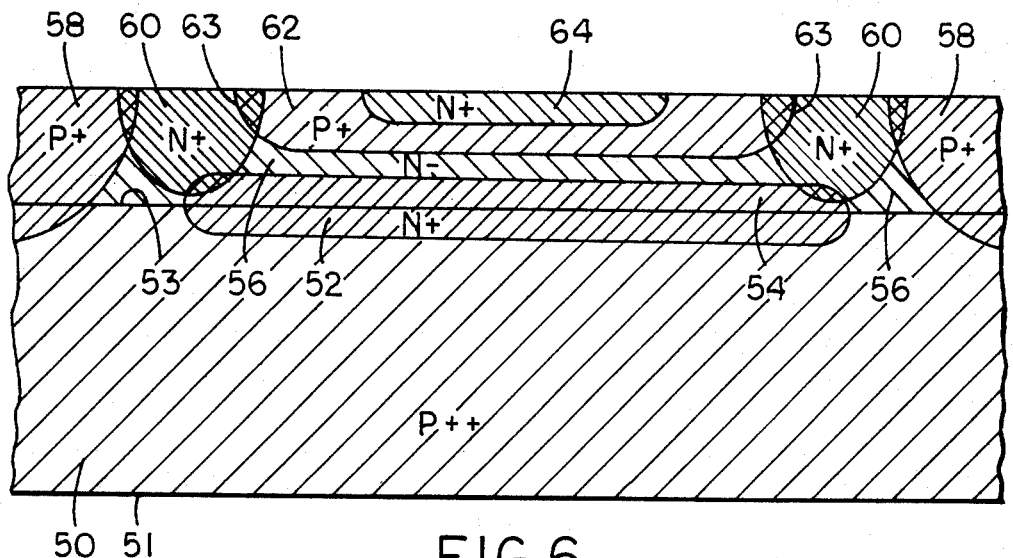

Attention is now directed to the nulling circuit connected to the output of comparator 20 for controlling the voltage at output A of amplifier 16. The function of the nulling circuit output is to form a feedback loop that constantly seeks to null the voltage out of output A for amplifier 16, and thereby avoid effects caused by ambient magnetic fields, temperature variations and deviations in processing of the integrated circuit in which this circuit is constructed, as is shown in FIGS. 4 through 6 and described below in detail. The nulling circuit includes a capacitor 38 shunted between the output of comparator 20 and ground. A series-connected transistor 42 and nulling impedance 44 are shunted between the output A and ground, with the base of transistor 42 coupled to the output of comparator 20 through a nulling impedance matching circuit 40. In operation, the nulling rate is constant, but dependant upon the values and characteristics of the various components forming the nulling circuit. As will be appreciated, the nulling circuit serves to control the feedback loop between output A of amplifier 16 and ground, as that current passes through transistor 42. In accordance with the present invention, the current level at the output of comparator 20 is on the order of 2 to 3 nanoamperes, and thus the characteristics of the transistors which form the comparator 20 require exceptionally low junction leakage characteristics.

Figure 2:
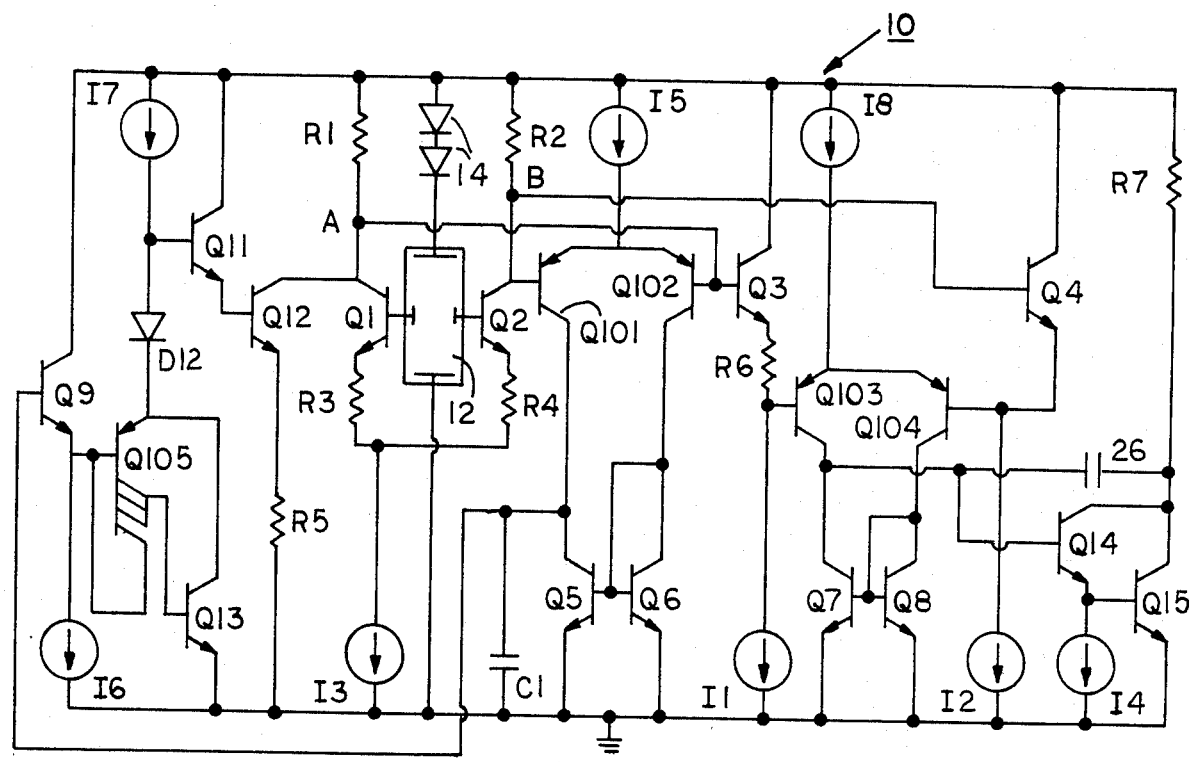
FIGS. 2 and 3 are circuit schematics further illustrating the electronic circuit of the present invention.
Figure 3:
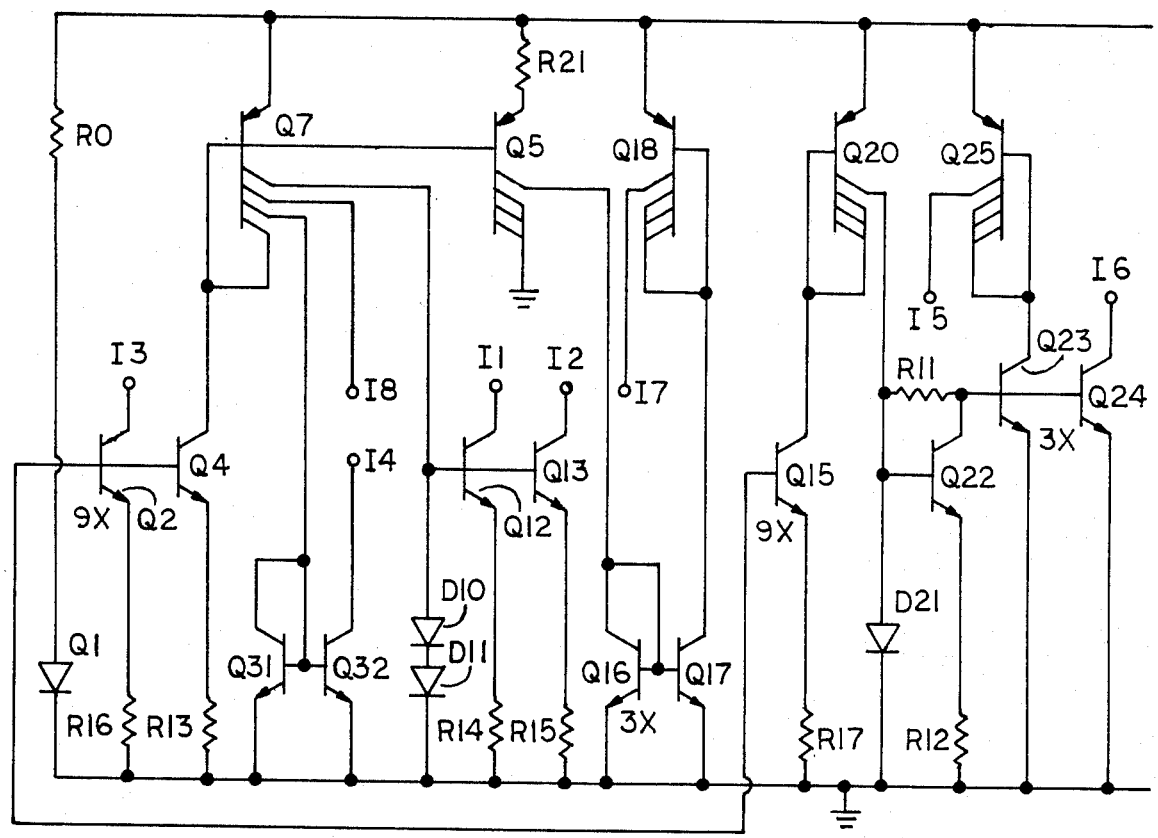

Attention is now drawn to FIGS. 2 and 3, which more specifically illustrate schematically the electronic circuit of FIG. 1.

Noting the left-middle portion of FIG. 2, there is illustrated the Hall-Effect sensor 12, and temperature compensating diodes 14. The amplifier 16 of FIG. 1 is made up of the following circuit components: transistors Q1 and Q2, resistors R1–R4 and current source I3. Current source I3, as shown in FIG. 3, consists of transistor Q2 and resistor R16. Typically, current source I3 provides a current on the order of 147 microamperes.

Now noting the right-middle portion of FIG. 2, the comparator 18 is characterized by transistors Q7, Q8, Q103 and Q104. Current sources I1 and I2, as shown in FIG. 3, consist of transistors Q12 and Q13, resistors R14 and R15 and diodes D10 and D11. Typically, current sources I1 and I2 provide a current on the order of 30 microamperes.

Impedance matching circuit 22 of FIG. 1 is defined by transistors Q3 and Q4 in the upper right-middle of FIG. 2.

The output driver section of the electronic circuit 10 of FIG. 1 includes transistors Q14 and Q15 (note extreme right hand portion of FIG. 2), together with capacitor 26 and resistor R7; it will be understood that transistors Q14 and Q15 form the circuit defined by transistor 24 of FIG. 1. Current source I4 is connected to the driver section of the circuit between transistors Q14 and Q15, and is shown more particularly in FIG. 3 where current source I4 is defined by transistor Q31 and Q32.

Attention is now drawn to the very center of FIG. 2. Comparator 20 of FIG. 1 is defined by transistors Q5, Q6, Q101 and Q102, together with current source I5. As shown in FIG. 3, current source I5 is defined by transistors Q25 (a multiple collector transistor for beta compensation) and Q23. Typically, current source I5 provides a current input to comparator 20 on the order of about 3 nanoamperes, for the reasons discussed above. Temperature and supply compensation with respect to current source I5 is provided by the combinations of transistors Q15, Q22, diode D21, and associated resistors as shown in FIG. 3. PNP beta compensation of transistor Q25 is provided by an identical multi-collector transistor Q20.

Reference is now made to the extreme left hand portion of FIG. 2, where there is depicted the nulling circuit. The nulling circuit includes capacitors C1, which is the nulling capacitor 38 of FIG. 1.

Outputs of amplifier 16 are shown in FIG. 2 by the same designations, that is points A and B. The nulling circuit includes transistors Q9, Q11, Q12, Q13 and Q105, together with diode D12 and resistor R5. The nulling circuit includes two current sources, I6 and I7, which are more particularly shown in FIG. 3. Current source I6 includes transistor Q24, the base of which is coupled across transistor Q22 and associated resistors. Typically, current source I6 is on the order of 3 nanoamperes.

Current source I7, as shown in FIG. 3, is defined by transistor Q17 and Q18, which typically provide a current on the order of 0.1 microamperes.

Current source I5 is coupled to the high side of transistors Q101 and Q102 in comparator 20 (note the top middle portion of FIG. 2). Similarly, current source I8 is coupled to the high side of comparator 18 to transistors Q103 and Q104, and is defined by transistor Q7 in FIG. 3. Typically, current source I8 provides a current input on the order of about 10 microamperes.

A construction of the electronic circuit 10 of FIGS. 1–3 in an intergrated circuit configuration will now be described with reference to FIGS. 4–6.

As shown in FIG. 4, the starting material is typically a monolithic silicon wafer having a 1-1-1 orientation off $4° \pm 0.5°$ and on the order of 10 mils thick. As shown, the monolithic wafer 50 has upper and lower surfaces 51 and 53, respectively, and is highly doped to the order of about 0.08–0.25 ohm-cm. A relatively highly doped N buried collector region 52 is diffused into the upper surface 53 of the monolithic chip 50, having a doping level about $10^{20}$.

Next, an epitaxial layer of silicon is grown on the upper surface 53 of the monolithic chip 50. In accordance with this invention, the epitaxial layer 56 comprises a lightly doped N region having a concentration on the order of $2 \times 10^{16}$. Deposition of the layer 56 results in the spreading of the buried portion of the collector region 52 upwardly, as shown at 54.

Referring now to FIG. 5, a P+ isolation ring 58 and an N+ collector contacting region 60 are diffused from the top surface of the epitaxial layer 56 into that layer. Typically, the collector ring 60 is diffused down to the buried N+ region 54. Next, a moderately doped base region 62 is diffused from the upper surface of the epitaxial layer into the relatively lightly doped N region 56 of the collector. In accordance with this invention, the interface of the moderately doped P+ region 62, which interface is designated as element 63, overlaps and extends into the collector ring 60. Typically, the moderately doped P+ base contact region 62 has a doping concentration on the order of $10^{18}$, and a sheet resistivity on the order of 150–400 ohms/sq.

Now referring to FIG. 6, a relatively highly doped emitter region 64 is diffused into the base contact region 62 from the upper surface of the epitaxial layer 56. Typically, the emitter region 64 has a doping level on the order of $10^{20}$. While not shown, it will be understood that the various diffusion techniques described above require the opening of diffusion passageways in a silicon dioxide layer on the upper surface of the epitaxial layer 56, and that the opening of those passageways controls the location of the various planar regions 58, 60, 62 and 64. Further, while not shown, as a final step the last silicon dioxide layer may be opened up to permit metalization patterns to be deposited in order to make contact to the various regions as desired. When the various transistors of the comparators 18 and 22 and the null circuit are fabricated in a monolithic integrated circuit in accordance with the diffusion profile and geometry of FIGS. 4–6, the resulting transistors are provided with a junction leakage current characteristic on the order of about 0.2 nanoamperes maximum, under non-operating conditions and at maximum operating temperatures (on the order of 125° C.). This characteristic permits the nulling circuit of FIG. 1 to null the current out of point A of amplifier 16 with extraordinarily low current characteristics. This in turn permits the entire circuit 10 of FIG. 1 to detect relatively small changes in the ambient magnetic field, as noted above, on the order of about 10 to 200 Gauss.

More particularly, the circuit 10 of FIG. 1 is capable of performing the function of sensing a magnetic pulse on the order discussed above, while ignoring the background field. Further, the circuit 10 operates without significant external components in a two-terminal configuration, over a wide temperature range, all while requiring very low (nanoamperes) currents and while incorporating the circuit 10 in a monolithic integrated circuit and permitting the use of an on-chip metal-oxide-semiconductor capacitor for use as the nulling capacitor 38.

The current source for the nulling stage associated with comparator 20 of FIG. 1 achieves reduced power sensitivity, temperature compensation and reduced supply sensitivity to transistor beta variations, which together with the features of the nulling circuit and the transistors associated with the comparators 18 and 20, permits the comparator 20 to operate at 2 to 3 nanoamperes ranges.

The two-terminal configuration of the circuit 10 of FIG. 1, in which terminal 32 provides supply and terminal 30 is ground, utilizes the external resistor 34 to provide hysteresis to prevent chatter, by adding positive feedback to the Hall-Effect sensor 12. This occurs because the signal increases as the circuit operates, increasing the voltage across the Hall-Effect sensor 12, thereby increasing its output which is proportional to the voltage across it. In operation, the signal from the Hall-Effect sensor 12 is first amplified by amplifier 16 which operates in a linear temperature compensated differential mode. The switching threshold between comparator 18 and the output of amplifier 16 is accomplished using emitter followers between the amplifier 16 and the output comparator 18 (note FIG. 2) and the offset generating resistor 36 coupled to the point A output of amplifier 16. Temperature compensation is accomplished with the associated current source.

Thus, the electronic circuit 10 of FIG. 1, which is shown in greater detail in FIGS. 2 and 3, provides a means for dynamically sensing and processing signals representative of changes in a magnetic field. This electronic circuit has particularly utility in sensing changes in a magnetic field in connection with fuel injection element sensing systems such as those disclosed in the aforementioned U.S. Pat. Nos. 4,359,895; 4,366,706; 4,386,522; and 4,397,180, to Wolff and/or to Wolff and Ziemacki. As discussed above, the electronic circuit 10 of FIG. 1 may be incorporated into a wide variety of lead, header and packaging arrangements, including but not limited to those arrangements disclosed in the aforementioned Wolff and Ziemacki references.

We claim:

1. An electronic circuit for dynamically sensing and processing signals representative of changes in a magnet field, said circuit comprising:

means for sensing a change in a magnetic field external to said circuit and providing an output representative of said change;

circuit means electronically coupled with said output of said sensing means for providing an output indicating the presence of said magnetic field change; and a nulling circuit coupled with said output of said sensing means and across said indicating circuit means for nulling said electronic circuit responsive to said sensing means output, to thereby avoid ambient magnetic fields, temperature and process variations, and wherein said nulling circuit comprises a capacitor coupled to the output of said nulling circuit, means for charging and discharging said capacitor responsive to any imbalance in the input to said nulling circuit, and circuit means coupling said capacitor with said output of said sensing means for nulling any imbalance during the charging or discharging of said capacitor.

2. The electronic circuit recited in claim 1 wherein said nulling circuit further comprises a comparator coupled between said sensing means and said capacitor.

3. The electronic circuit recited in claim 2 wherein said comparator is formed of transistors having a junction leakage current characteristic on the order of about 0.2 nanoamperes in non-conducting and high operating temperature conditions.

4. The electronic circuit recited in claim 1 wherein said nulling circuit further comprises an impedance matching circuit coupled between said sensing means and said capacitor.

5. The electronic circuit recited in claim 1 further comprising a linear temperature compensated differential amplifier coupled to the output of said sensing means and to the input of said indicating means and said nulling circuit.

6. The electronic circuit recited in claim 1 wherein said circuit comprises a two-terminal network.

7. The electronic circuit recited in claim 6 wherein said sensing means comprises a Hall-Effect sensor.

8. The electronic circuit recited in claim 7 further comprising means with said two-terminal network for providing positive feedback to said Hall-Effect sensor, to thereby introduce hysteresis.

9. An electronic circuit having only two terminals for dynamically sensing and processing signals representative of changes in a magnetic field, said circuit comprising:

a Hall-Effect sensor coupled between said two terminals for sensing a change in a magnetic field external to said circuit and providing an output representative of said change;

circuit means electronically coupled with said output of said Hall-Effect sensor for providing an output across said two terminals for indicating the presence of said magnetic field change; and means with said circuit for providing positive feedback to said Hall-Effect sensor, to thereby introduce hysteresis, said positive feedback means including a capacitor coupled to the output of said positive feedback circuit, means for charging and discharging said capacitor responsive to any imbalance in the input to said positive feedback circuit, and circuit means coupling said capacitor with said output of said sensor for nulling any imbalance during the charging or discharging of said capacitor.

10. The two-terminal electronic circuit recited in claim 9 wherein said positive feedback means is coupled with the output of said Hall-Effect sensor and across said indicating circuit means for nulling the output of said Hall-Effect sensor over time, to thereby compensate for ambient magnetic fields, temperature and process variations.

* * * * *